United States Patent
Thompson

(10) Patent No.: US 7,604,840 B2
(45) Date of Patent: Oct. 20, 2009

(54) ATOMIC LAYER DEPOSITION OF COPPER USING SURFACE-ACTIVATION AGENTS

(75) Inventor: Jeffery Scott Thompson, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 704 days.

(21) Appl. No.: 11/204,823

(22) Filed: Aug. 16, 2005

(65) Prior Publication Data

US 2006/0134331 A1    Jun. 22, 2006

Related U.S. Application Data

(60) Provisional application No. 60/601,786, filed on Aug. 16, 2004.

(51) Int. Cl.
*C23C 16/00* (2006.01)
(52) U.S. Cl. ............... 427/248.1; 427/301; 427/252
(58) Field of Classification Search ............ 117/88, 117/104; 427/301
See application file for complete search history.

(56) References Cited

U.S. PATENT DOCUMENTS

| | | | | |
|---|---|---|---|---|
| 3,900,320 A | * | 8/1975 | Rolker et al. | 430/324 |
| 4,171,393 A | * | 10/1979 | Donley et al. | 427/354 |
| 4,301,196 A | * | 11/1981 | McCormack et al. | 427/99.1 |
| 4,956,197 A | * | 9/1990 | Babu et al. | 427/536 |
| 6,369,256 B1 | | 4/2002 | Chi et al. | |
| 2003/0129308 A1 | * | 7/2003 | Chen et al. | 427/255.28 |
| 2003/0143839 A1 | * | 7/2003 | Raaijmakers et al. | 438/633 |
| 2003/0232142 A1 | * | 12/2003 | Bradley et al. | 427/304 |
| 2004/0009665 A1 | | 1/2004 | Chen et al. | |
| 2004/0092096 A1 | | 5/2004 | Raaijmakers et al. | |

FOREIGN PATENT DOCUMENTS

WO    WO 03/095701 A1    11/2003

OTHER PUBLICATIONS

M. Ritala et. al., Atomic Layer Deposition, Handbook of Thin Film Materials, 2001, vol. 1, Chapter 2, Academic Press (Book not Included).
P.M. Jeffries et. al., Metal-Organic Chemical Vapor Deposition of Copper and Copper (I) Oxide From Copper (I) Tert Butoxide, Chem. Mater., 1992, vol. 4:1169-1175.
Tobias Torndahl et. al., Growth of Copper Metal by Atomic Layer Deposition Using Copper (I) Chloride, Water and Hydrogen as Precursors, Thin Solid Films, 2004, vol. 458:129-136.
International Search Report Dated Mar. 27, 2006, International Application No. PCT/US2005/029439, International Filing Date: Aug. 16, 2005.

* cited by examiner

*Primary Examiner*—Timothy H Meeks
*Assistant Examiner*—Joseph Miller, Jr.

(57) ABSTRACT

The present invention relates to a novel atomic layer deposition process for the formation of copper films on substrates or in or on porous solids in an atomic layer deposition process.

17 Claims, No Drawings

ATOMIC LAYER DEPOSITION OF COPPER USING SURFACE-ACTIVATION AGENTS

FIELD OF THE INVENTION

The present invention relates to a novel atomic layer deposition process for the formation of copper films on substrates or in or on porous solids in an atomic layer deposition process.

TECHNICAL BACKGROUND

Atomic layer deposition (ALD) processes are useful for the creation of thin films, as described by M. Ritala and M. Leskela in "Atomic Layer Deposition" in *Handbook of Thin Film Materials*, H. S. Nalwa, Editor, Academic Press, San Diego, 2001, Volume 1, Chapter 2. Such films, especially metal and metal oxide films, are critical components in the manufacture of electronic circuits and devices.

In an ALD process for depositing copper films, a copper precursor and a reducing agent are alternatively introduced into a reaction chamber. After the copper precursor is introduced into the reaction chamber and allowed to adsorb onto a substrate, the excess (unadsorbed) precursor vapor is pumped or purged from the chamber. This process is followed by introduction of a reducing agent that reacts with the copper precursor on the substrate surface to form copper metal and a free form of the ligand. This cycle can be repeated if needed to achieve the desired film thickness.

The ligands coordinated to the metal complex used in the ALD processes must be stable with respect to decomposition and be able to desorb from the complex in a metal-free form. Following reduction of the copper, the ligand is liberated and must be removed from the surface to prevent its incorporation into the metal layer being formed.

In the deposition of metal films by the typical, two-step ALD process, reactivity must be designed into the precursor to enable self-limiting adsorption to the substrate surface. Because a metal surface has no functional groups, this reactivity must be built into the precursor. The initial deposition requires a transformation, such as loss of a ligand, that is induced thermally. The requirement is the source of the conflicting requirements for a metal precursor. The compound must be stable enough to be transferred into the deposition chamber, but reactive enough to undergo a transformation at the substrate surface to form a monolayer of a nonvolatile complex on the substrate ready for the transformation into a pure, conformal metal film.

SUMMARY OF THE INVENTION

One aspect of the present invention is a process for depositing copper films on a surface, comprising:
a. exposing a substrate to a surface-activating agent to form a deposit of a surface-activating group on the substrate;
b. exposing the deposit of the surface-activating group on the substrate to a copper precursor to form a deposit of a copper complex on the substrate; and
c. reacting the deposited copper complex with a reducing agent to form a deposit of copper metal on the substrate.

DETAILED DESCRIPTION

Applicant has discovered an atomic layer deposition (ALD) process suitable for creation of copper films for use as seed layers in the formation of copper interconnects in integrated circuits, or for use in decorative or catalytic applications. This process comprises the sequential introduction of three reagents into the deposition chamber: a surface-activating agent, a copper precursor, and a reducing agent. The surface-activating agent is an organic molecule that chemisorbs to the substrate to form monolayer coverage of a surface-activating group. This group is a weak acid that donates a proton to the copper complex in a subsequent step to cause the copper ion to chemisorb to the surface. This process uses copper complexes in either the +1 or +2 oxidation state that are volatile and thermally stable. The ligands are chosen to form copper complexes that are volatile in an appropriate temperature range but do not decompose in this temperature range; rather, the complexes react with the chemisorbed surface-activating group on contract and are then reduced to metal on addition of a suitable reducing agent. The ligands are chosen to react with the chemisorbed surface-activating group at a temperature below the thermal decomposition temperature of the copper complex. In the process of this invention, there is no adsorption of the copper precursor to the substrate surface in the absence of the surface-activating group. The ligands and surface-activating groups are further chosen so that they will desorb without decomposition upon exposure of the copper complex to a reducing agent. The reduction of these copper complexes to copper metal by readily available reducing agents has been demonstrated to proceed cleanly at moderate temperatures.

The process described herein involves introduction of three reagents into the deposition chamber: a surface-activating agent, a copper precursor, and a reducing agent. The introduction of each reagent can be followed by a purge step to remove any reagent that is not adsorbed to the substrate surface. The next reagent is then added. Selection of process conditions such as temperature, pressure, length of pulse of reagent and purge time will depend on individual chamber and system design, and the desired process rate.

In the process described in this invention, a monolayer of the surface-activating group is formed on the substrate surface prior to introduction of the copper precursor. The surface-activating agent desirably chemisorbs to the substrate and has a proton available that is acidic enough to protonate the copper precursor on contact. Ideally, the surface-activating agent will show self-limiting adsorption to the substrate surface to form a monolayer on the substrate. Alternatively, the amount of reagent that adsorbs can be controlled by the amount of reagent introduced into the chamber.

The addition of this surface-activating agent allows the use of a more stable metal precursor and/or lower reaction temperatures than are used in typical ALD processes. Thermal degradation of the copper precursor to induce chemisorption is not needed and should be avoided. Selective adsorption of the copper precursor will result because the metal complex chemisorbs only where the surface-activating agent is adsorbed. In this process, an acid derived from the surface-activating group is used to protonate the metal complex to liberate one of the ligands to generate a less volatile, or even nonvolatile, complex on the surface. The protonated ligand from the copper precursor can be removed during a subsequent purge step. This protonation/ligand liberation reaction takes place only while there are protons available on the substrate surface. Once these protons are consumed, the reaction stops. There is no thermal degradation at the temperature of these reactions. In the absence of the surface-activating group, there is no deposition of precursor and therefore no film formation.

The choice of surface-activating agent will depend on the substrate onto which copper is deposited and the copper precursor itself. The surface-activating agent is chosen to be able to protonate a ligand on the copper. In this application, basic ligands, with p$K_a$ values 12 or greater, are used on the copper precursor. This choice permits the use of weak acids as surface-activating groups. For formation of a copper seed layer on a metal barrier-adhesion layer, imines (HN=$CR_2$) and aromatic nitrogen heterocycles such as pyrazole and substituted pyrazoles such as 3,4,5-trimethylpyrazole have the desired properties of volatility, affinity for metal surfaces, and acidity.

In the process of this invention, the copper precursor is selected from a group consisting of bis(aminoethanolate)copper(II), copper(I) dialkyamides, bis(dimethylaminopropanolate)copper(II), (bis(trimethylsily)amido)-copper(I), copper (I) t-butoxide, and copper complexes represented by structures (I)-(V):

(I)

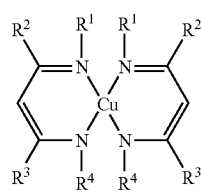

wherein
- $R^1$ and $R^4$ are independently selected from a group consisting of H, $C_1$-$C_5$ alkyl, and dimethylamino;
- $R^2$ and $R^3$ are independently selected from a group consisting of H, $C_1$-$C_5$ alkyl, phenyl, benzyl, and 4-pyridinyl, with the proviso that the total number of carbons in $R^1$-$R^4$ of a given ligand is 4-12;

(II)

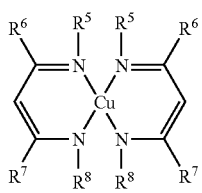

wherein
- $R^5$ and $R^8$ are dimethylamino; and
- $R^6$ and $R^7$ are independently selected from a group consisting of H, $C_1$-$C_5$ alkyl, phenyl, benzyl, and 4-pyridinyl, with the proviso that the total number of carbons in $R^5$-$R^8$ of a given ligand is 4-14; or
- $R^5$ and $R^8$ are independently selected from a group consisting of H, $C_1$-$C_5$ alkyl, and dimethylamino; and
- $R^6$ and $R^7$ are selected from a group consisting of H, $C_1$-$C_5$ alkyl, phenyl, benzyl, and 4-pyridinyl, with the proviso that either $R^6$ or $R^7$ is 4-pyridinyl, and with the proviso that the total number of carbons in $R^5$-$R^8$ of a given ligand is 4-14;

(III)

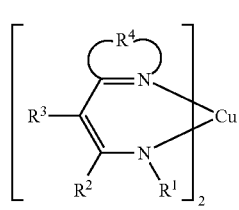

wherein
- $R^1$, $R^2$ and $R^3$ are independently selected from a group consisting of hydrogen, methyl, ethyl, propyl, isopropyl, isobutyl, and neopentyl;
- $R^4$ is —$(CH_2)_n$—, where n is 3, 4, or 5;

(IV)

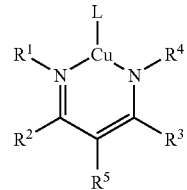

wherein
- L is selected from a group consisting of $C_2$-$C_{15}$ olefins, $C_2$-$C_{15}$ alkynes, nitriles, aromatic heterocycles, and phosphines;
- $R^1$ and $R^4$ are independently selected from a group consisting of hydrogen, methyl, ethyl, propyl, isopropyl, isobutyl, and neopentyl;
- $R^2$, $R^3$ and $R^5$ are independently selected from a group consisting of hydrogen, fluorine, trifluoromethyl, phenyl and $C_1$-$C_{10}$ alkyl groups; and (V)

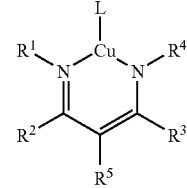

wherein
- L is selected from a group consisting of $C_2$-$C_{15}$ olefins, $C_2$-$C_{15}$ alkynes, nitriles, aromatic heterocycles, and phosphines;
- $R^1$ and $R^4$ are independently selected from a group consisting of hydrogen, methyl, ethyl, propyl, isopropyl, isobutyl, neopentyl and $C_3$-$C_5$ alkylene;
- $R^2$, $R^3$ and $R^5$ are independently selected from a group consisting of hydrogen, fluorine, trifluoromethyl, phenyl, $C_1$-$C_{10}$ alkyl and $C_3$-$C_5$ alkylene; with the proviso that at least one of ($R^1$, $R^2$) and ($R^3$, $R^4$) taken together is —$(CR^6R^7)_n$— where $R^6$ and $R^7$ are independently selected from a group consisting of hydrogen, fluorine, trifluoromethyl, $C_1$-$C_5$ alkyl, $C_1$-$C_5$ alkyl ester, and n is 3, 4 or 5.

The reducing agent is selected from a group consisting of 9-BBN (9-borabicyclo[3.3.1]nonane); diborane; boranes of the form $BR_xH_{3-x}$, where x=0, 1 or 2, and R is independently selected from a group consisting of phenyl and $C_1$-$C_{10}$ alkyl groups; dihydrobenzofuran; pyrazoline; disilane; silanes of the form $SiR'_yH_{4-y}$, where y=0, 1, 2 or 3, and R' is independently selected from a group consisting of phenyl and $C_1$-$C_{10}$ alkyl groups; and germanes of the form $GeR''_zH_{4-z}$, where z=0, 1, 2, or 3, and R" is independently selected from a group consisting of phenyl and $C_1$-$C_{10}$ alkyl groups.

Suitable reducing agents for the copper deposition process of this invention include 9-BBN, borane, diborane, dihydrobenzofuran, pyrazoline, germanes, diethylsilane, dimethylsilane, ethylsilane, phenylsilane, silane and disilane. Diethylsilane and silane are preferred.

The deposition process of this invention improves upon the processes described in the art by allowing the use of lower temperatures and producing higher quality, more uniform films. The process of this invention also provides a more direct route to a copper film, avoiding the formation of an intermediate oxide film.

In the copper deposition process of this invention, the copper can be deposited on the surface, or in or on porosity, of the substrate. Suitable substrates include conducting, semi-conducting and insulating substrates, including substrates that are typically used in the electronics industry to manufacture ultra large scale integrated circuits. Suitable substrates typically comprise copper, silicon, silicon dioxide, low k substrates, or low k substrates coated with a barrier layer to prevent the migration of copper. Suitable barrier layers include tantalum, tantalum nitride, titanium, titanium nitride, tantalum silicon nitride, titanium silicon nitride, tantalum carbon nitride, tungsten carbonitride, and niobium nitride. "Low k" substrates have a dielectric constant ("k") less than about 4. Suitable low k substrates include doped oxides (e.g., FSG, HSQ, MSQ, HOSP), organics (e.g., SiLK, BCB, FLARE, PAE), highly fluorinated materials (e.g., parylene-F, a-CF, and PTFE), and porous materials (e.g., aerogel and xerogel). Ultra large integrated circuits typically contain many millions of gates and hundreds of millions of individual transistors.

This process can be repeated to build up thicker layers of copper, or to eliminate pin-holes.

The deposition of the copper complex is typically conducted at 0° C. to 200° C. The reduction of the copper complex is typically carried out at similar temperatures, 0° C. to 200° C.

In the process of this invention, it is initially a copper complex that is deposited on the surface-activated substrate, although the deposited copper complex may be the product of the reaction of the surface-activating group and the copper precursor, rather than the copper precursor itself. The formation of a metallic copper film does not occur until the copper complex is exposed to the reducing agent.

Aggressive reducing agents are preferred to reduce the copper complex rapidly and completely. Desirable reducing agents are volatile and do not decompose on heating. It is also desirable that the reducing agents be of sufficient reducing power to react rapidly on contact with the copper complex deposited on the substrate surface. One feature of these reducing agents is the presence of a proton donor. The reducing reagent should be able to transfer electrons to reduce the copper ion of the complex and also transfer protons to protonate the ligand. The oxidized reducing agent and the protonated ligand should be able to be easily removed from the surface of the newly formed copper deposit.

In one embodiment of the copper deposition process, the surface-activating agents and copper complexes are added to a reactor so as to attain a suitable fluence of complex to the surface of the substrate. After at least a portion of these reagents has been deposited on the substrate (e.g., a coated silicon wafer), the undeposited material in the gas phase is pumped or purged from the chamber and then the reducing agent is introduced into the chamber at a pressure of approximately 50 to 760 mtorr to reduce the adsorbed copper complex. The substrate is held at a temperature between approximately 0° C. to 200° C. during reduction. With suitable combinations of copper complex and reducing agent, this reduction is typically at least 90% complete within 20 minutes. Reducing agent exposure times can be from less than a second to several minutes.

The surface activating group, the ligands on the copper precursor and the reducing agent are chosen so that the products from this reduction reaction are readily removed from the surface of the substrate under the reducing conditions.

EXAMPLES

Unless otherwise stated, all organic reagents are available from Sigma-Aldrich Corporation (Milwaukee, Wis., USA).

Example 1

Deposition of Copper Film

The copper precursor (vinyltrimethylsilyl)(N,N'-diethyl-2,4-pentanediketiminato)copper(I) was prepared according to a literature procedure (PCT/US2004/011734, filed Apr. 16, 2004). Gold film was prepared by evaporation of gold onto a Ti/SiO$_2$/Si wafer. Wafer was cut into 0.6 cm×0.6 cm pieces. The gold layer was 750 Å thick. Prior to use, the piece was sputter etched at $10^{-9}$ torr to a clean gold surface and transported to a Vacuum Atmospheres dry box with a continuous boil-off nitrogen purge in an evacuated transfer vessel; the wafer was not exposed to the ambient atmosphere. The wafer was heated at 250° C. for two hours prior to deposition reactions.

The following procedure was used to deposit a copper film. The wafer was contacted with a 10 μM solution of 2,2,4,4-tetramethyl-pentanone imine in hexane. This soak was typically overnight, but was as short as 0.75 hours or as long as several days. The sample was removed from the hexane solution and allowed to dry in the dry box atmosphere. The wafer and a ceramic boat containing ~0.050 g of the copper(I) precursor were loaded into the deposition chamber. Both pieces were heated to 60° C. at 100-200 mtorr pressure. Helium gas was used as a carrier gas to maintain this pressure; the gas flowed over the ceramic boat and then the wafer. This flow was maintained for approximately two hours. The boat containing the remaining precursor was cooled to room temperature. Diethylsilane was then introduced into the deposition chamber from a glass bubbler with the helium flow passing through the diethylsilane before introduction to the deposition chamber. A volume of 1-2 mL diethylsilane was introduced to the deposition chamber in this manner. The chamber was then evacuated to remove excess diethylsilane. The wafer was transferred to the dry box. The process was repeated 22 times. A faint copper color developed. ESCA analysis confirms the deposition of a thin, copper metal film.

In this deposition, copper is deposited on the substrate only. No copper film appears on the walls of the deposition chamber at 60° C. At 110° C., copper appears on the substrate and the walls of the deposition chamber because this temperature is above the thermal decomposition temperature of the precursor.

The invention claimed is:

1. A process for depositing copper films on a surface, comprising:
   a. exposing a substrate to a surface-activating agent to form a deposit of a surface-activating agent on the substrate, wherein the surface-activating agent is selected from the group consisting of imines and aromatic nitrogen heterocycles;
   b. exposing the deposit of the surface-activating group on the substrate to a copper precursor vapor to form a deposit of a copper complex adsorbed on the substrate; and c. reacting the adsorbed copper complex with a reducing agent to form a deposit of copper metal on the substrate.

2. The process of claim 1, wherein copper precursor is selected from the group consisting of bis(aminoethanolate) copper(II), copper(I) dialkyamides, bis(dimethylaminopropanolate)copper(II), and (bis(trimethylsily)amido)-copper (I), and copper(I) t-butoxide.

3. The process of claim 1, wherein the copper precursor is selected from the group consisting of copper complexes represented by structure (I):

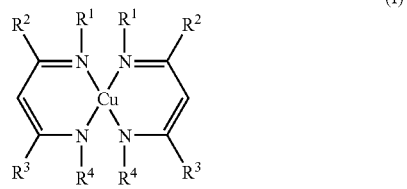

(I)

wherein
R$^1$ and R$^4$ are independently selected from the group consisting of H, C$_1$-C$_5$ alkyl, and dimethylamino;
R$^2$ and R$^3$ are independently selected from the group consisting of H, C$_1$-C$_5$ alkyl, phenyl, benzyl, and 4-pyridinyl, with the proviso that the total number of carbons in R$^1$-R$^4$ of a given ligand is 4-12.

4. The process of claim 1, wherein the copper precursor is selected from the group consisting of copper complexes represented by structure (II):

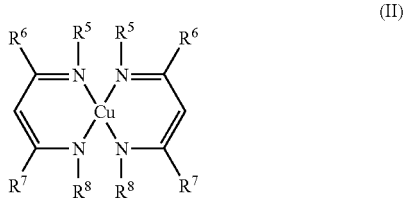

(II)

wherein
R$^5$ and R$^8$ are dimethylamino; and
R$^6$ and R$^7$ are independently selected from the group consisting of H, C$_1$-C$_5$ alkyl, phenyl, benzyl, and 4-pyridinyl, with the proviso that the total number of carbons in R$^5$-R$^8$ of a given ligand is 4-14; or
R$^5$ and R$^8$ are independently selected from the group consisting of H, C$_1$-C$_5$ alkyl, and dimethylamino; and
R$^6$ and R$^7$ are selected from the group consisting of H, C$_1$-C$_5$ alkyl, phenyl, benzyl, and 4-pyridinyl, with the proviso that either R$^6$ or R$^7$ is 4-pyridinyl, and with the proviso that the total number of carbons in R$^5$-R$^8$ of a given ligand is 4-14.

5. The process of claim 1 wherein the copper precursor is selected from the group consisting of copper complexes represented by structure (III):

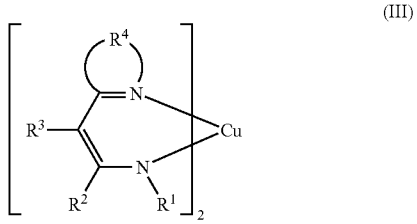

(III)

wherein R$^1$, R$^2$ and R$^3$ are independently selected from the group consisting of hydrogen, methyl, ethyl, propyl, isopropyl, isobutyl, and neopentyl; and
R$^4$ is —(CH$_2$)$_n$—, where n is 3, 4, or 5.

6. The process of claim 1 wherein the copper precursor is selected from a the group consisting of copper complexes represented by structure (IV):

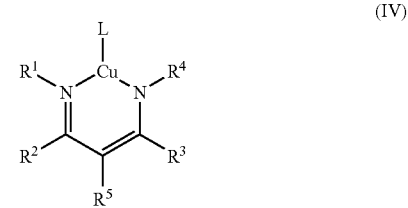

(IV)

wherein
L is selected from the group consisting of C2-C15 olefins, C2-C15 alkynes, nitriles, aromatic heterocycles, and phosphines;
R1 and R4 are independently selected from the group consisting of hydrogen, methyl, ethyl, propyl, isopropyl, isobutyl, and neopentyl; and R2, R3 and R5 are independently selected from the group consisting of hydrogen, fluorine, trifluoromethyl, phenyl and C1-C10 alkyl groups.

7. The process of claim 1, wherein the copper precursor is selected from the group consisting of copper complexes represented by structure (V):

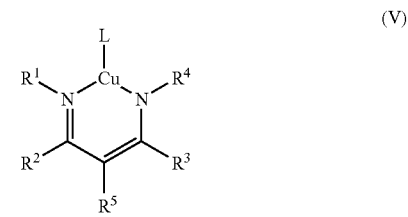

(V)

wherein
L is selected from the group consisting of C$_2$-C$_{15}$ olefins, C$_2$-C$_{15}$ alkynes, nitriles, aromatic heterocycles, and phosphines;
R$^1$ and R$^4$ are independently selected from the group consisting of hydrogen, methyl, ethyl, propyl, isopropyl, isobutyl, neopentyl and C$_3$-C$_5$ alkylene;
R$^2$, R$^3$ and R$^5$ are independently selected from the group consisting of hydrogen, fluorine, trifluoromethyl, phenyl, C$_1$-C$_{10}$ alkyl and C$_3$-C$_5$ alkylene; with the proviso that at least one of (R$^1$, R$^2$) and (R$^3$, R$^4$) taken together is —(CR$^6$R$^7$)$_n$— where R$^6$ and R$^7$ are independently selected from the group consisting of hydrogen, fluorine, trifluoromethyl, C$_1$-C$_5$ alkyl, C$_1$-C$_5$ alkyl ester, and n is 3, 4 or 5.

8. The process of claim 1, wherein the nitrogen heterocycle is selected from a group consisting of pyrazole and substituted pyrazoles.

9. The process of claim 1, wherein the reducing agent is selected from the group consisting of 9-borabicyclo[3.3.1] nonane; diborane; boranes of the form BR$_x$H$_{3-x}$, where x=0, 1 or 2, and R is independently selected from the group consisting of phenyl and C$_1$-C$_{10}$ alkyl groups;
dihydrobenzofuran; pyrazoline; disilane; silanes of the form SiR'$_y$H$_{4-y}$, where y=0, 1, 2 or 3, and R' is independently selected from the group consisting of phenyl and C$_1$-C$_{10}$ alkyl groups; and germanes of the form GeR″$_z$H$_{4-z}$, where z=0, 1, 2, or 3, and R″ is independently selected from the group consisting of phenyl and C$_1$-C$_{10}$ alkyl groups.

10. The process of claim 9, wherein the reducing agent is selected from the group consisting of 9-borabicyclo[3.3.1] nonane, borane, diborane, dihydrobenzofuran, pyrazoline, germanes, diethylsilane, dimethylsilane, ethylsilane, phenylsilane, silane and disilane.

11. The process of claim 1, wherein the substrate is selected from the group consisting of copper, silicon, silicon dioxide, low k substrates, or low k substrates coated with a barrier layer to prevent the migration of copper.

12. The process of claim 11, wherein the barrier layer is selected from the group consisting of tantalum, tantalum nitride, titanium, titanium nitride, tantalum silicon nitride, titanium silicon nitride, tantalum carbon nitride, tungsten carbonitride, and niobium nitride.

13. The process of claim 1, wherein the substrate is exposed to a vapor of the copper complex.

14. The process of claim 1, further comprising a purging step to remove undeposited surface-activating agent after exposing the substrate to a surface-activating group, but before exposing the deposit of the surface-activating group on the substrate to a copper precursor.

15. The process of claim 1, further comprising an evacuation step to remove undeposited surface-activating agent after exposing the substrate to a surface-activating group, but before exposing the deposit of the surface-activating group on the substrate to a copper precursor.

16. The process of claim 1, further comprising a purging step to remove undeposited copper complex before exposing the deposited complex to a vapor of the reducing agent.

17. The process of claim 1, further comprising an evacuation step to remove undeposited copper complex by vacuum or purging before exposing the deposited complex to a vapor of the reducing agent.

* * * * *

UNITED STATES PATENT AND TRADEMARK OFFICE
CERTIFICATE OF CORRECTION

PATENT NO.      : 7,604,840 B2                                          Page 1 of 1
APPLICATION NO. : 11/204823
DATED           : October 20, 2009
INVENTOR(S)     : Jeffery Scott Thompson It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1011 days.

Signed and Sealed this

Fifth Day of October, 2010

David J. Kappos
*Director of the United States Patent and Trademark Office*